US007020856B2

(12) United States Patent
Singhal et al.

(10) Patent No.: US 7,020,856 B2
(45) Date of Patent: Mar. 28, 2006

(54) METHOD FOR VERIFYING PROPERTIES OF A CIRCUIT MODEL

(75) Inventors: Vigyan Singhal, Fremont, CA (US); Joseph E. Higgins, Albany, CA (US)

(73) Assignee: Jasper Design Automation, Inc., Mountain View, CA (US)

( * ) Notice: Subject to any disclaimer, the term of this patent is extended or adjusted under 35 U.S.C. 154(b) by 20 days.

(21) Appl. No.: 10/389,316

(22) Filed: Mar. 14, 2003

(65) Prior Publication Data

US 2003/0208730 A1 Nov. 6, 2003

Related U.S. Application Data

(60) Provisional application No. 60/377,392, filed on May 3, 2002.

(51) Int. Cl.
*G06F 17/50* (2006.01)

(52) U.S. Cl. .................................. 716/4; 716/5; 716/6

(58) Field of Classification Search ................ 716/4–6; 703/2

See application file for complete search history.

(56) References Cited

U.S. PATENT DOCUMENTS

| | | | | |
|---|---|---|---|---|
| 6,102,959 | A * | 8/2000 | Hardin et al. | 703/2 |
| 6,185,516 | B1 * | 2/2001 | Hardin et al. | 703/2 |
| 6,594,804 | B1 * | 7/2003 | Hojati | 716/5 |
| 6,725,431 | B1 * | 4/2004 | Yang | 716/4 |
| 2004/0123254 | A1 * | 6/2004 | Geist et al. | 716/4 |

OTHER PUBLICATIONS

Biere, A. et al., "Verifying Safety Properties Of A PowerPC™* Microprocessor Using Symbolic Model Checking Without BDDs**," CAV'99, LNCS 1633, 1999, pp. 60-71.

Clarke, E. et al., "Counterexample-Guided Abstraction Refinement," Computer Aided Verification, 12th International Conference, CAV 2000, Jul. 15-19, 2000, pp. 154-169.

Kushan, R., "Model Checking And Abstraction*," SARA 2002, LNAI 2371, 2002, pp. 1-17.

* cited by examiner

*Primary Examiner*—Vuthe Siek
(74) *Attorney, Agent, or Firm*—Fenwick & West LLP

(57) ABSTRACT

Methodology for verifying properties of a circuit model in context of given environmental constraints is disclosed. Verification of a specified property is performed by analyzing only a portion of the circuit model. The present methodology is also directed towards reducing the computation time for verifying the specified property. Further, the present methodology allows the connection of an additional circuit model to the circuit model in a non-intrusive manner. The connection is made without making any modifications to the description of the circuit model. This permits the straightforward specification of related environmental constraints and properties, which makes it possible to verify correct behavior of complex interfaces.

25 Claims, 18 Drawing Sheets

118 Environmental Constraint: (X_0&(!X_1)&(!X_2))|(X_1&(!X_0)&(!X_2))|(X_2&(!X_1)&(!X_0))

120 Property: PREV_OUT_0|PREV_OUT_1|(OUT_0&(!OUT_1))

400

| DATABASE ID | OBJECT TYPE | OBJECT INPUTS | NAME |
|---|---|---|---|
| 0 | INPUT | NONE | IN_0 |
| 1 | INPUT | NONE | CLK |
| 2 | INPUT | NONE | IN_1 |
| 3 | REGISTER | 0,1 | Q_0 |
| 4 | REGISTER | 2,1 | Q_1 |
| 5 | BUFFER | 3 | X_0 |
| 6 | INVERTER | 3 | X_1 |
| 7 | BUFFER | 4 | X_2 |
| 8 | INVERTER | 4 | X_3 |
| 9 | AND | 5,7 | OUT_0 |
| 10 | AND | 6,7 | OUT_1 |
| 11 | AND | 5,8 | OUT_2 |
| 12 | AND | 6,8 | OUT_3 |

PROPERTY:

```
(OUT_0&(!OUT_1)&(!OUT_2)&(!OUT_3))|
(OUT_1&(!OUT_0)&(!OUT_2)&(!OUT_3))|
(OUT_2&(!OUT_0)&(!OUT_1)&(!OUT_3))|
(OUT_3&(!OUT_0)&(!OUT_1)&(!OUT_2))
```

FIG. 6

1802 REQ_VALID = IDLE | (REQ_SEEN & REQ) | (WAIT & (!REQ))

1804 ACK_VALID = ((IDLE | WAIT) & (!ACK)) | REQ_SEEN

2002

| DATABASE ID | TYPE | INPUTS | NAME |
|---|---|---|---|
| ... | ... | ... | ... |
| 100 | BUFFER | 90 | REQ |
| 101 | BUFFER | 91 | ACK |
| 102 | BUFFER | 92 | CLK |
| ... | ... | ... | ... |
| 113 | INPUT | NONE | REQ_IN |
| 114 | INPUT | NONE | ACK_IN |
| 115 | INPUT | NONE | CLK_IN |
| ... | ... | ... | ... |

2004

| FROM ID | TO ID |
|---|---|
| 113 | 100 |
| 114 | 101 |
| 115 | 102 |

FIG. 20

METHOD FOR VERIFYING PROPERTIES OF A CIRCUIT MODEL

RELATED APPLICATION

This application claims priority to U.S. Provisional application Ser. No. 60/377,392 filed on May 3, 2002.

BACKGROUND

The present invention generally relates to the field of hardware circuit verification by means of a software circuit model. More specifically, the present invention relates to verifying the behavior of a logic level circuit model to satisfy certain specified properties.

Recent increases in the complexity of modern integrated circuits has exacerbated the difficulty of verifying design correctness. The verification phase of a typical integrated circuit design project consumes approximately 70–80% of the total time and resources dedicated to a project. Flaws in the design that are not found during the verification phase have significant economic impact in terms of increased time-to-market and reduced profit margins.

A typical integrated circuit design flow includes many steps that proceed in a sequential manner, with each step depending on the results of the previous step. Consequently, when a flaw is discovered in a step, all the previous steps must be repeated, often at a significant cost. Hence, it is highly desirable to find and fix design flaws as early as possible in a design flow.

Traditionally, simulation-based techniques have been used to verify design correctness. Transistor-level simulation based techniques were used in the early 1970s and logic gate-level simulation based techniques were used in the late 1980s. As the complexity of designs increased with the passage of time, drawbacks associated with these techniques came into light. These techniques became less effective because of their inability to completely and quickly verify large designs. A popular alternative is the use of Register Transfer Language (RTL)-level simulation. Contemporary verification and debugging tools use various levels of abstractions for defining design specifications. These abstractions are expressed in high-level description languages. High-level description languages provide a number of functionalities for analyzing and verifying a design while performing simulation. For example, a designer can navigate the design hierarchy, view the RTL source code, and set breakpoints on a statement of an RTL source code to stop the simulation. Also, line numbers are provided in the RTL source code to identify different lines and statements. Further, the verification and debugging tools often support viewing and tracing variables and some times even signal values. These RTL-level simulation tools typically also offer these and other types of RTL debugging functionalities.

The verification tools as mentioned above typically follow a design flow. In the first step of the design flow, the conceptual nature of the integrated circuit is determined. The desired functionality of a circuit is expressed as a collection of properties or specifications, and possibly as a model of the behavior in a high-level language such as C++. The RTL model of the digital circuit is built based upon knowledge of the specifications or the high-level model. The RTL model is expressed in a hardware description language (HDL) such as Verilog available from Cadence Design Systems, Inc. of Santa Clara, Calif. or VHDL available from IEEE of New York, N.Y. Many other steps such as synthesis, timing optimization, clock tree insertion, place and route, etc., yield subsequent transformations of the design. These transformations eventually result in a set of masks that are fabricated into integrated circuits. The current invention is targeted at finding design flaws in the RTL model of the design, which is a very early phase of the design flow.

In the design flow, creation of RTL source code is followed by verification so as to check the compliance of the RTL source code to the design specifications. Three approaches commonly used to verify the design at the RTL level are simulation, emulation and formal methods.

Simulation is one of the most prevalent methods used to determine whether the design is in accordance with the specifications by simulating the behavior of the RTL model. The simulation process uses RTL source code and a “Test Bench” to verify a design. The Test Bench contains a subset of all possible inputs to the circuit/logic. For an ‘n’ input circuit, there are $2^n$ possible inputs at any given time. For large n, e.g., for a complex design, the number of possible input sequences becomes prohibitively large. To simplify this, only a subset of all possible inputs is described in any given Test Bench. An example of such a tool is Ncverilog from Cadence Design Systems, Inc. of Santa Clara, Calif. To simulate the RTL model, a Test Bench must be created that provides appropriate input stimulus to the RTL model. Creating the Test Bench is a time consuming process. The process of simulating the Test Bench is also time consuming. Furthermore, it is effectively impossible to create enough test cases to completely verify that the specified properties of the design are true. This is because of the sheer number of possible inputs, and also because it requires in-depth knowledge and tremendous creativity on the part of the Test Bench creator to imagine the worst-case scenarios.

Emulation is similar to simulation, except that the design is mapped to special purpose hardware rather than simulating the design on a general-purpose computer. Emulation is significantly faster than simulation, but shares the same problems with Test Bench generation and creating worst-case scenarios.

An increasingly popular alternative is to use formal methods to completely verify properties of a design. Formal methods use mathematical techniques to prove that a design property is either always true, or to provide an example input sequence (referred to as a counterexample) demonstrating that the property is false. Tools using formal methods to verify properties are known as Model Checkers. An example of a conventional model checking tool is the Formal Check tool from Cadence Design Systems, Inc. of Santa Clara, Calif.

FIG. 1 shows an example of a property 120 and an environmental constraint 118 that could be applied to a circuit model 100. Property 120 specifies the behavior of the output signals (OUT_0 110, OUT_1 112, PREV_OUT_0 114, PREV_OUT_1 116) Environmental constraint 118 is a Boolean expression that specifies constraint on the input signals (X_0 102, X_1 104, X_2 106).

When the conventional method is applied to verify the property of a circuit model, there are three possible outcomes: (1) The system determines that the property is true for all input sequences that satisfy the set of environmental constraints. (2) The system is unable to make a determination due to lack of computing resource (time or memory). (3) The system determines that the property is false. In the latter case, the conventional system produces a counterexample that satisfies the set of environmental constraints, but for which the property fails to be true.

Two issues inhibit the widespread use of model checking. The first is performance. Resources used to perform verification are typically exponentially related to the number of registers in the circuit model. This is referred to as the "state space explosion" problem. Many conventional Model Checkers analyze the entire design before proving a particular property. The complexity and size of modern integrated circuits, combined with the state space explosion problem, make it impossible to use such Model Checkers on large designs.

Instead of analyzing the entire design, other conventional Model Checkers analyze a portion of the design relevant to a particular property. This includes all portions of the design between the signals relevant to the property and the primary inputs. An example of a conventional system that implements this property dependent design analysis is the COSPAN model checking engine referred to in R. P. Kurshan, "Formal Verification in a Commercial Setting", Design Automation Conference, pp. 258–262, June 1997, Anaheim, Calif. However, even the property relevant portion of the design can be very large. Thus, in this case the state space explosion problem can result in severe performance problems.

No conventional system permits complete control over the region of the circuit model to be examined when verifying a particular property. The user typically resorts to manually modifying the design by removing and replacing parts of the design in order to determine if a property is true. An example of this design surgery is described in S. G. Govindaraju et al., "Counterexample-Guided Choice of Projections in Approximate Symbolic Model Checking", IEEE International Conference on Computer-Aided Design, pp. 115–119, November 2000. This modification of the design introduces the possibility of human error and requires additional steps.

Another issue that inhibits widespread use of model checking is usability. In the conventional systems, it is impossible to express many practical environmental constraints and properties without either modifying the design, or without a detailed knowledge of the internal details of the design. The set of environmental constraints and properties of interface protocols can be encapsulated in an additional circuit model known as a monitor. An example of a monitor may be found in K. Shimizu et al., "Monitor-Based Formal Specification of PCI", Proceedings of the 3rd International Conference of Formal Methods in Computer-Aided Design, November 2000. This additional circuit model allows users to easily express environmental constraints and related properties. But no conventional system permits the user to connect an additional circuit model such as an interface monitor to a circuit model without modifying the design.

Hence, there is a need for a system and a method that verifies a circuit model in a short duration of time. Further, there is a need for a system and a method that permits complete control over the region of the circuit model to be examined while checking for a particular property and that does not involve any modification of the design. There is also a need for a method and a system that permits the user to connect an additional circuit model representing the environmental constraints of a circuit model without modifying the design. Also, there is a need for a system and a method that verifies the design of a circuit model without modifying the design.

SUMMARY

The present invention is directed to a system and a method for verifying properties of a circuit model.

An object of the present invention is to provide a system and a method to verify properties of a circuit model in context of a set of environmental constraints.

Another object of the present invention is to provide a system and a method that permits complete control over a region of the circuit model to be examined when verifying a specified property.

Another object of the present invention is to provide a system and a method to improve upon the existing property checking techniques to reduce computation time for verification.

Another object of the present invention is to provide a system and a method that permits the user to connect an additional circuit model to verify the properties of the circuit model.

Yet another object of the present invention is to provide a system and a method that permits the user to connect an additional circuit model to verify the properties of a circuit model without modifying the design of the circuit model.

To attain the above objectives, the first step is to choose a property to be verified in context of a circuit model under a set of environmental constraints. Thereafter, a region of the circuit model is selected to verify the property of the circuit model. The circuit model region is characterized by a property input boundary that defines the input to the selected circuit model region. Specifying the property input boundary allows the user to have complete control over the region of the circuit model being examined to prove the specified property. After the selection of the circuit model region, the property is verified. If the property is true, the process is stopped. If the property verification gives a false result, then the values of signals for which the property gives a false result are provided to the user. Based on the result provided, the user determines if the failure is due to design error. The process stops if the false result is due to the design error. Otherwise, the initially selected circuit model region is modified and the property is again verified. In this manner, the property of the circuit model is iteratively verified. Using this method, all properties of the circuit are verified considering one at a time. The selection of the initial property input boundary and the subsequent updates can be done automatically or interactively by the user. Thus, instead of analyzing the entire design, only a portion is analyzed for verification. This saves computation time for verification. Further, the present invention also allows the user to save and restore the property input boundaries in the form of data files on the computer system.

Additionally, the present invention provides a method to reduce the computation time for the verification method. The method uses the information regarding the Known Reachable and Known Unreachable states of the circuit model from the previous runs to reduce the iterations involved for verifying the properties.

The present invention also allows the user to verify a circuit model by changing the environmental constraints rather than expanding the property input boundary. This is achieved by adding new logic in the form of an additional circuit model outside the circuit model without making any modifications to the circuit model. The present invention permits the user to connect the additional circuit model to the existing circuit model in order to specify related properties and environmental constraints. This has the advantage that the user can define properties and environmental constraints entirely in terms of the primary inputs and outputs of the circuit model. The user does not need to understand the internal details of the circuit model being checked. Further, no modification in the circuit model is required to connect to the additional circuit model. Hence, the invention eliminates time consuming and error prone user modifications of the circuit model.

BRIEF DESCRIPTION OF THE DRAWINGS

The preferred embodiments of the invention will hereinafter be described in conjunction with the appended drawings provided to illustrate and not to limit the invention, wherein like designations denote like elements, and in which:

FIG. 4 is a data structure in tabular form representing the circuit model of FIG. 3.

FIG. 6 shows a property, in textual form, whose validity is affected by different property input boundary choices.

FIG. 20 is a data structure in tabular form depicting the connection (as shown in FIG. 19) of the additional circuit model and the circuit model.

DESCRIPTION OF PREFERRED EMBODIMENTS

The present invention provides a method and a system for verification of RTL-level circuit models using formal methods. For the purpose of clarity, the terms used for describing the present invention are defined below.

The term "formula" describes a Boolean formula consisting of signals and operators in a circuit model. Examples of operators are AND, OR, NOT and other operators related to time. An example of an operator related to time is one that refers to the previous value of a signal. Such operators are well known in the art such as that described in K. McMillan, "Symbolic Model Checking", PhD. thesis, Carnegie Mellon University, May 1992. The formula can have either a true (1), or a false (0) value.

Figure 1:
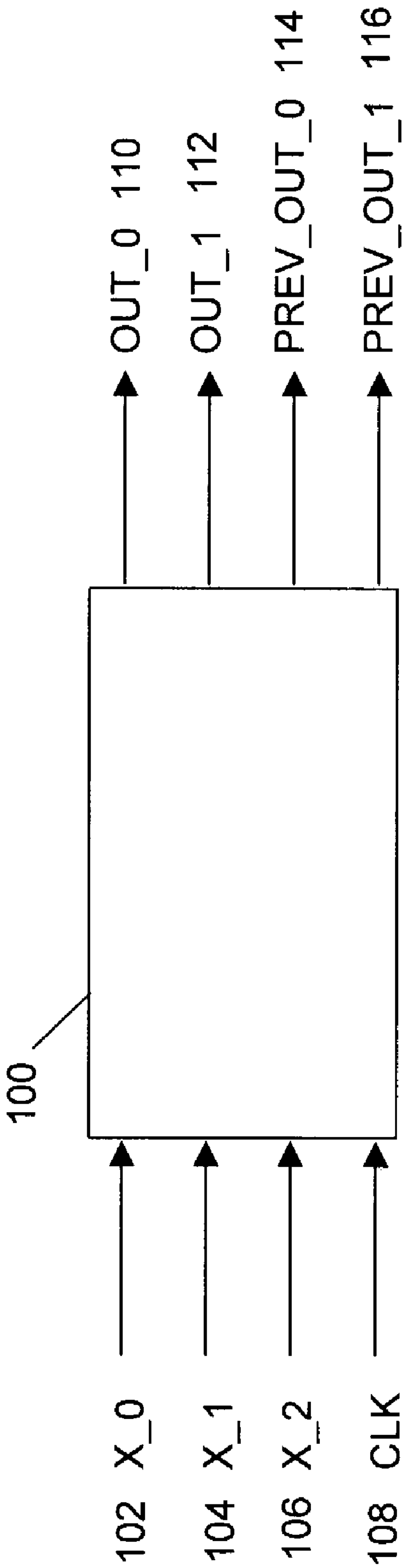
FIG. 1 is a block diagram depicting an example of a circuit model, an environmental constraint applied on the circuit model input and a desired property that the circuit model should satisfy.

The term "property" defines a desirable behaviour of the circuit model in terms of a formula. The user wishes to check if a property is true or false in the context of a circuit model. FIG. 1 shows an example of a property 120 for a circuit model 100. Signals X_0 102, X_1 104, X_2 106 and CLK 108 are input to circuit model 100. Signals OUT_0 110, OUT_1 112, PREV_OUT_0 114 and PREV_OUT_1 116 are output of circuit model 100. Signals PREV_OUT_0 114 and PREV_OUT 1 116 represent the values of signals OUT_0 110 and OUT_1 112 delayed by one clock cycle. Property 120 requires that if signals (OUT_0 110, OUT_1 112) have the value (1, 0) at any cycle, then their value at the previous clock cycle must be (0, 0).

The term "environmental constraint" describes a constraint on the signals of a circuit model in terms of a formula. The term "environmental constraint" is also referred to as "assumption". A property is verified in context of a set of environmental constraints, all the environmental constraints being true in the circuit model. The set of environmental constraints may be a null set (i.e. no environmental constraints) or may comprise one or more environmental constraints. Referring again to FIG. 1, property 120 is checked whether it is true or false by assuming that an environmental constraint 118 is true. Environmental constraint 118 specifies that inputs (X_0 102, X_1 104, X_2 106) may only take values (0, 0, 1), (0, 1, 0) or (1, 0, 0) when proving property 120 of circuit model 100.

Figure 3:
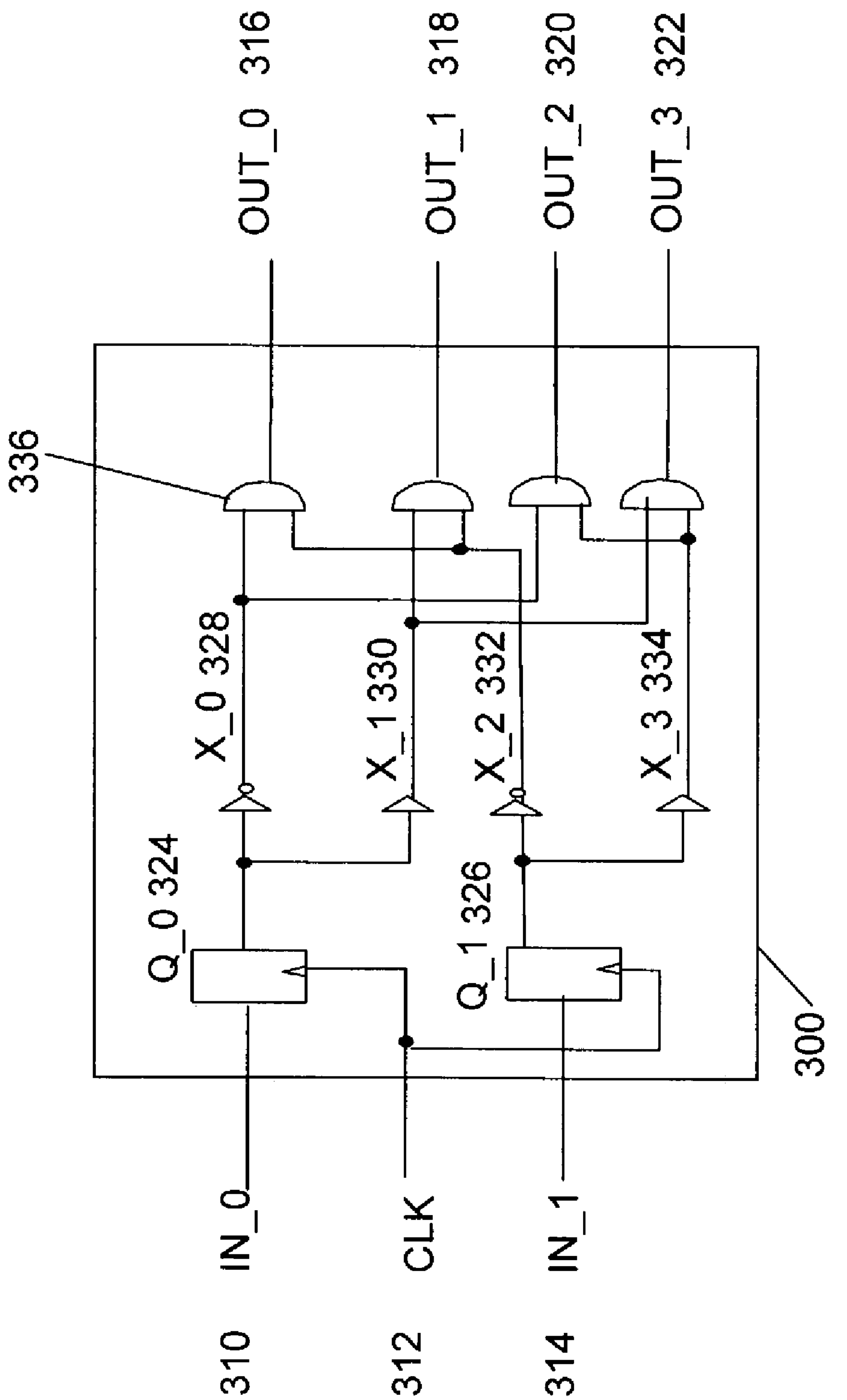
FIG. 3 is a circuit diagram depicting examples of possible property input boundaries of a circuit model.

The term "property input boundary" describes a collection of signals that are treated as inputs to check a property. For example in FIG. 3, a property may refer to signals OUT_0 316, OUT_1 318, OUT_2 320 and OUT_3 322. The three possible property input boundaries for this property are (1) Q_0 324 and Q_1 326, or (2) X_0 328, X_1 330, X_2 332 and X_3 334, or (3) IN_0 310, CLK 312 and IN_1 314.

Figure 5:
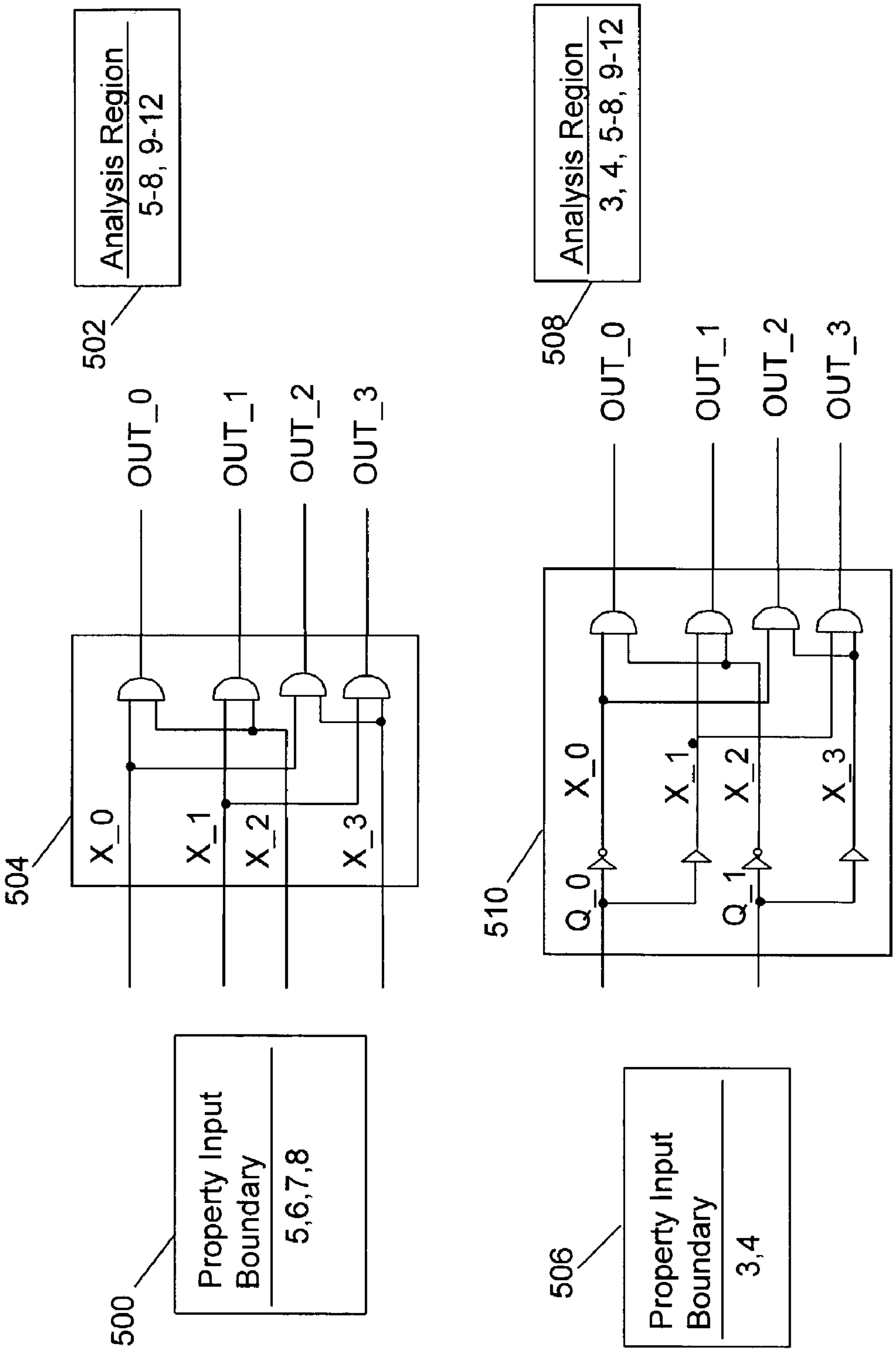
FIG. 5 shows two different property input boundaries for circuit model of FIG. 3.

The term "analysis region" comprises the following signals: (1) all signals referred to by a property (2) all signals in a property input boundary (3) all signals that lie on a signal path between a signal referred to by a property and a signal in the property input boundary. An analysis region corresponds to a particular property input boundary, and similarly, a property input boundary defines a corresponding analysis region. Hence, the two terms are herein used interchangeably in the description. FIG. 5 shows the correspondence between a property input boundary and an analysis region. Property input boundary 500 corresponds to analysis region 502 and vice versa. Similarly property input boundary 506 corresponds to analysis region 508 and vice versa.

Figure 2:
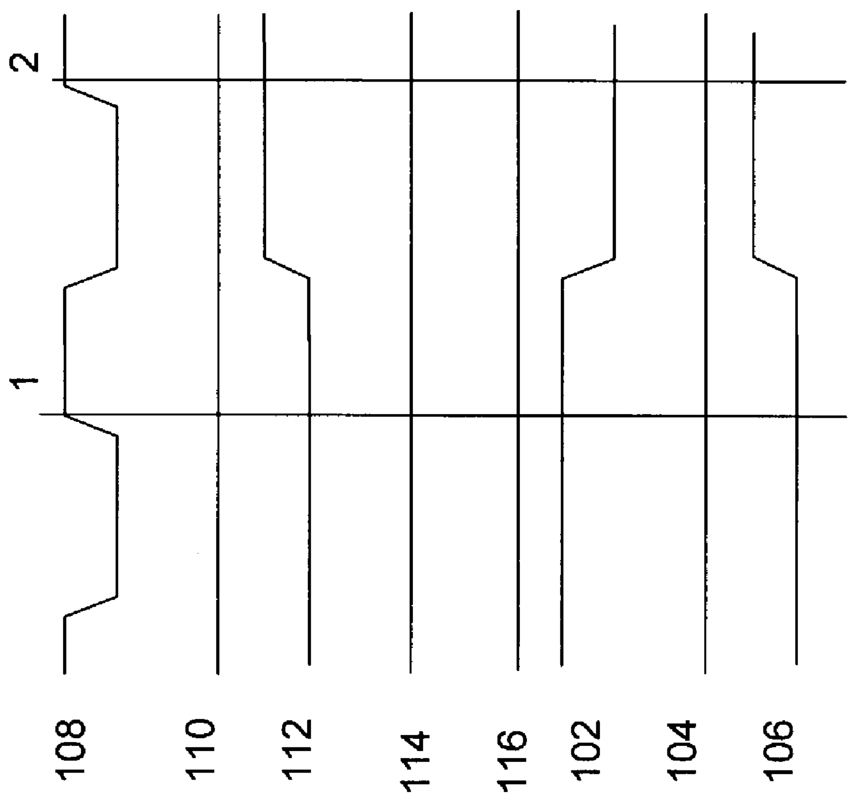
FIG. 2 is a timing diagram depicting an example sequence of input values that cause the circuit model to violate the desired property. The figure also shows the consequent output values.

The term "counterexample" describes a sequence of values for inputs in a property input boundary that results in the property having a false value. The sequence of values must satisfy the set of environmental constraints. FIG. 2 provides a counterexample for property 120 in FIG. 1. Values of input signals X_0 102, X_1 104 and X_2 106 as shown in FIG. 2 satisfy environmental constraint 118. Property 120 becomes false (0) for the values of signals PREV_OUT_0 114, PREV_OUT_1 116, OUT_0 110 and OUT_1 112 as indicated in FIG. 2.

The term "false negative" describes a case when a property is determined to be false in context of a property input boundary, but a different property input boundary exists in which the property can be shown to be true. An example of a false negative is furnished in FIG. 5 and FIG. 6.

The term "Boolean decision diagram" (BDD) refers to graph based algorithms used for representing Boolean function manipulation. BDD is well known in the art. A description of the techniques used to create and manipulate BDDs may be found in R. E. Bryant, "Graph-Based Algorithms for Boolean Function Manipulation", IEEE Transactions on Computers, Vol. C-35, No. 8, August 1986, pp. 677–691.

The term "design hierarchy" describes a collection of sub-designs and the manner in which they are interconnected. The design hierarchy has exactly one top-level design. The top-level design is further subdivided into sub-designs. A sub-design can be encapsulated into a single unit and repeatedly instantiated inside other designs.

The term "wide signal" describes a collection of single bit signals that are referred to collectively by a single name. For example, single bit signals X[0], X[1] and X[2] comprise a 3 bit wide signal named X.

The term "array signal" describes a selected bit of a wide signal. For example, signals X[0], X[1] and X[2] are all array signals corresponding to wide signal X.

The term "memory signal" describes a selected bit of a wide signal, where the selection is not a constant, but a variable. For example, X[Y] where 'Y' is a variable, refers to a memory signal.

The term "select operator" describes an operator whose output is a contiguous selection of bits from a list of input signals. For example, signal "indicator[counter]" describes the output of a select operator that selects single bit (as specified by "counter") of the signal "indicator". (This example is also referred to as a "bit select" since it selects a single bit of the input.) By way of another example, "indicator[15:8]" describes the output of a select operator that selects 8 bits (bit 8 through bit 15 inclusive) of the input signal "indicator". (This example is often referred to as a "part select".)

A circuit model is typically described in terms of a data structure. FIG. 4 shows a typical data structure 400 used to represent circuit model 300 of FIG. 3. Each object in circuit model 300 has a corresponding database id, object type, a collection of object inputs (represented by database ids) and a name that can be used to refer to the object in a data structure in an independent manner. For example, in FIG. 3 object 336 is an AND gate with input signals X_0 328 and X_2 332 and output signal OUT_0 316. Hence, the data structure of FIG. 4 represents object 336 in FIG. 4 with a database id of 9, an object type of AND, a collection of input database ids 5 and 7 referring to input signals X_0 328 and X_1 332 and a name OUT__0. Property input boundary data structure 400 so generated can also be saved to a data file on the user's computer system. The saved data structure can be restored if required by the user. The techniques for saving and restoring generic data in a data structure are well known in the art.

Figure 7:
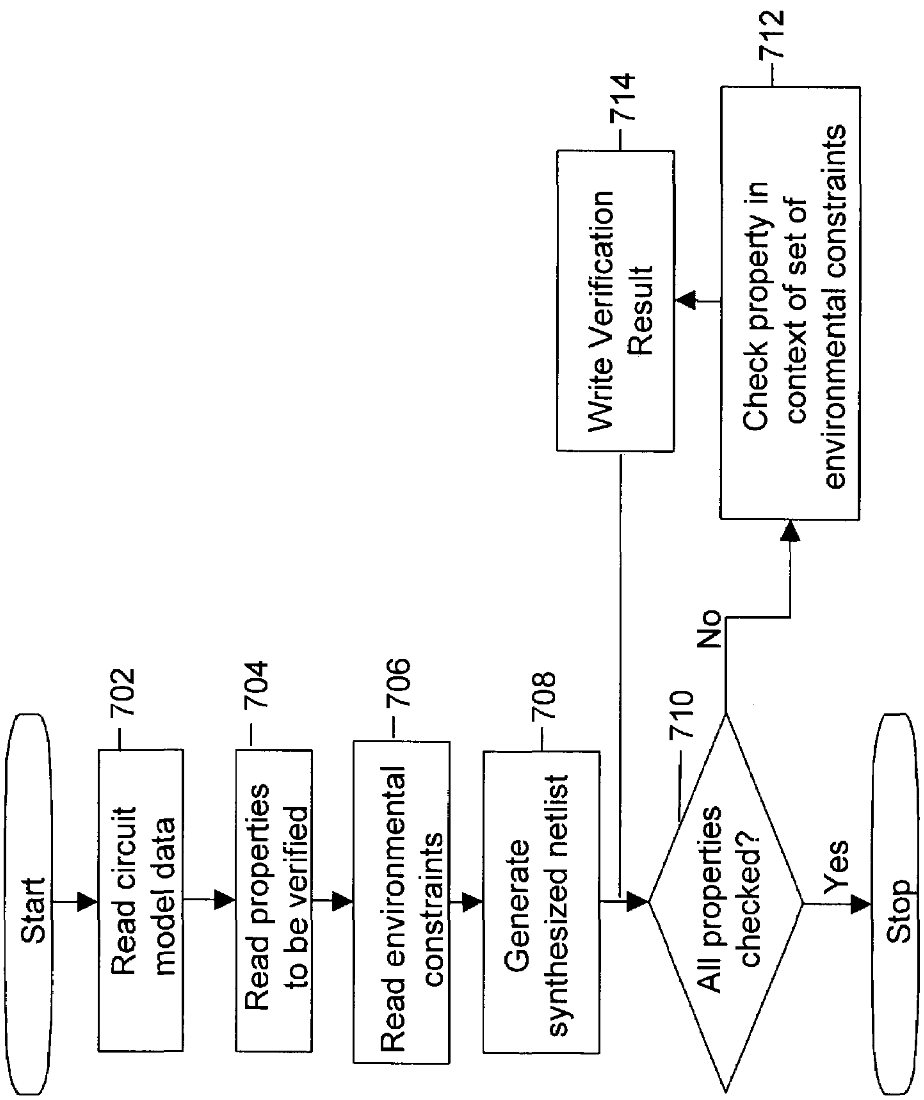
FIG. 7 is a flowchart depicting a conventional method for verifying a plurality of properties of a circuit model.

The flowchart in FIG. 7 shows a conventional method for verifying a plurality of properties for a circuit model. This verification is performed using a technology well-known in the art such as that described in K. McMillan, "Symbolic Model Checking", PhD. thesis, Carnegie Mellon University, May 1992. In order to describe the invention, this method is explained henceforth.

The method reads circuit model data in step 702, properties to be verified in step 704 and the set of environmental constraints in step 706. A synthesized netlist of the circuit model is then generated in step 708. A netlist is a list of components such as gates, flip-flops etc. A netlist describes the properties of the components and the connections between them. A check is made in step 710 to confirm whether all the properties have been verified. If all the properties have not been verified, the next property is verified in context of a set of environmental constraints in step 712. After verification, the result is provided to the user in step 714. After verification of all the properties, the method terminates.

The abovementioned conventional method only permits the property input boundary to be the primary inputs of the circuit model. Step 712 uses a method well known in the state-of-the-art to check if a property is true or false. For purposes of clarity, and to highlight the improvements made by the current invention, this method (hereon referred as Method A) is described using a flowchart in FIG. 8.

The first step of Method A involves building a BDD in step 802 for each register in the specified circuit model. The BDD represents the next-state function of a register. These BDDs are functions of the primary inputs of the circuit model as well as the state variables of the circuit model. Here, each state variable represents the output of a register. Next step 804 involves building a BDD for the combinational condition that represents a violation of the specified property for the circuit model. Step 804 is followed by step 806 that involves building a BDD for initial state set. Initial state set is defined as the set of states that the circuit model can attain after the circuit model has been initialized or reset. Further, a current reachable set is defined in step 808. The current reachable set is defined as the set of states that the circuit model can attain at the time of observation. The current reachable set is initialized to the initial state set. This is followed by a check in step 810 to verify whether the current reachable set intersects the BDD built in step 804. If the check results in a true condition then it implies that the specified property is not verified for the specified circuit model. Hence, a counterexample is generated according to step 812 and it is reported that the property is false in step 814. The method then terminates. If the check in step 810 results in a false condition, it implies that the property has been verified. In this scenario, next reachable set is computed in step 816 using the BDD for next-state functions built in step 802. A check in step 818 is then performed to verify if the next reachable set equals the current reachable set. If the check results in true condition then the method moves to step 822. In step 822, the result is reported and the method terminates. If the false condition is generated in step 818, then in step 820 the current reachable set is set to the newly computed next reachable set of step 816. The control is then returned back to step 810. The process is thereafter repeated for the updated current reachable set.

Figure 8:
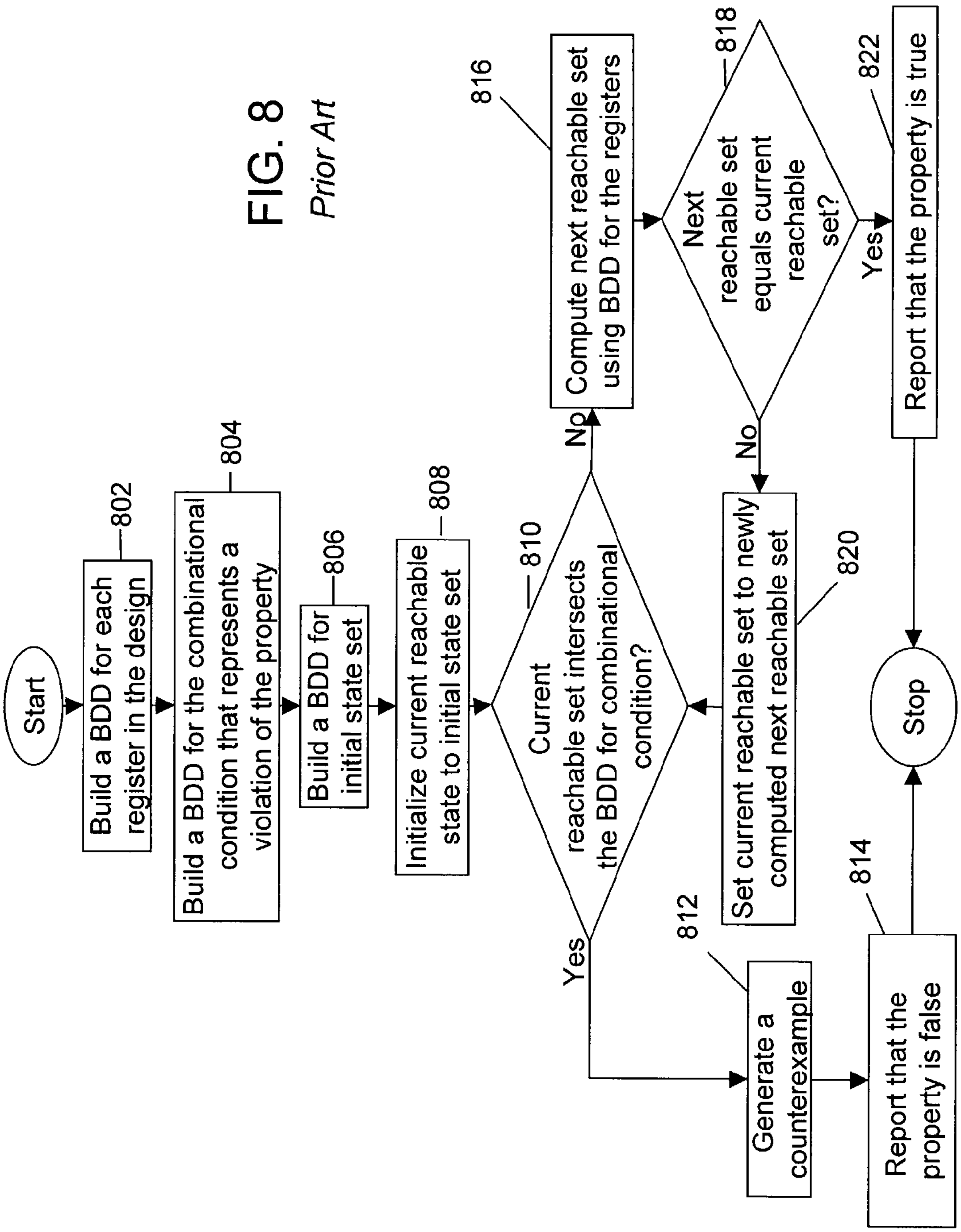
FIG. 8 is a flowchart depicting the conventional method to verify a property of a circuit model.

The preferred embodiment describes a method that improves upon the conventional methods (as shown in FIG. 7 and FIG. 8) in many ways. The flowchart in FIG. 9 describes a method in accordance with the preferred embodiment of the present invention to verify a property of a given circuit model in conjunction with a set of environmental constraints. The circuit model data, properties to be verified and the set of environmental constraints are taken as input from the user. A synthesized netlist is generated for the input data. An initial property input boundary is identified in step 902. The choice of the initial property input boundary may be performed either automatically or interactively by the user using appropriate methods described later. Method A is used to check the property in context of the initial property input boundary in step 904. Analysis region corresponding to the initial property input boundary is used in step 904 (instead of the entire design as in step 802 of Method A). If the property is true in context of the current property input boundary, then a true result is provided to the user in step 910. If the property is false, counterexample is provided to the user in step 908. The counterexample is created by Method A. In step 912, the user examines the counterexample. The user determines if the counterexample represents a design error or a false negative. If the user determines that the counterexample represents a design error, then the false result and the counterexample are provided to the user in step 916. The process terminates after step 916. Otherwise, the user modifies the current property input boundary or the set of environmental constraints in step 914. After the above step, checking of the property for the modified analysis region in conjunction with the set of environmental constraints is preformed in step 904. Thus, the property is verified iteratively.

Figure 9:
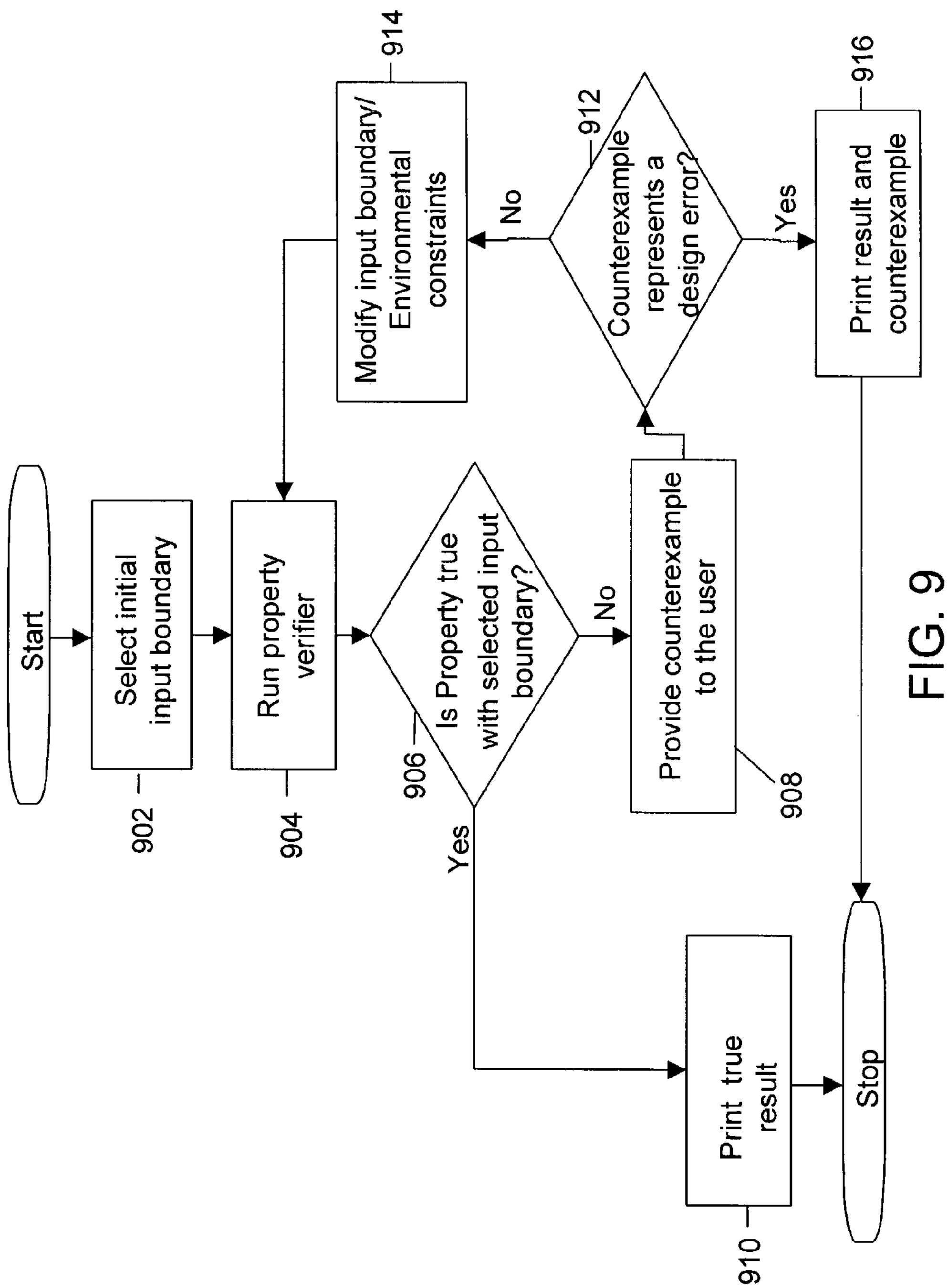
FIG. 9 is a flowchart depicting an interactive method to verify a property in accordance with the present invention.

The preferred embodiment allows the user to run multiple different checks for each property using different analysis regions. The successive runs may have different analysis regions or set of environmental constraints. The analysis regions are typically a small fraction of the size of the entire design. Hence, the analysis region can be analyzed in significantly less time as compared to the entire design. This feature improves the run-time from days of computer time to seconds using present invention. Henceforth, all the steps of the flowchart described in FIG. 9 are elaborated in detail.

The preferred embodiment allows the user to specify an arbitrary property input boundary for a property. This is explained with reference to FIG. 5 that describes various property input boundary choices for circuit model 300. The property input boundary is represented as a collection of database ids as described in FIG. 4. For example, property input boundary 500 refers to signals X_0 328, X_1 330, X_2 332 and X_3 334 in FIG. 3. With this choice of property input boundary 500, circuit model 504 is equivalent to circuit model 300. Another example shows a property input boundary 506, which refers to signals Q_0 324 and Q_1 326. With this choice of property input boundary 506, circuit model 510 is equivalent to circuit model 300.

FIG. 5 also illustrates the methodology of choosing the property input boundary to check a property 600. For example, assume that the user wishes to check property 600 of FIG. 6 in context of circuit model 300. If property input boundary 500 of FIG. 5 is chosen, then property 600 is false. This is because the assignment X_0=0, X_1=0, X_2=0 and X_3=0 results in property 600 having a false value. However, if the property input boundary is expanded to 506 of FIG. 5, then property 600 is true. This is because any choice of values for Q_0 324 and Q_1 326 results in property 600 having the true value. Thus, property 600 can be determined to be true without entirely examining circuit model 300. The false property value computed in context of property input boundary 500 is a false negative. This is because property 600 is true for another choice of property input boundary 506.

For large circuit models, appropriate choice of an analysis region significantly reduces the parts of the circuit model that need to be examined to check a given property. This leads to a significant speedup in the amount of time taken to verify a property. Further, if a property check results in false, the analysis region can be iteratively modified to check the property with the modified analysis region. The user performs the modification either automatically or in an interactive manner. The method of automatic computation of initial analysis region is described hereinafter.

The method of determining an initial analysis region requires the concept of "State Machine" signals and "constant-driven" signals. The method to identify the set of constant-driven signals is described subsequently.

Constant-driven signals are defined by the following rules:

1. A constant signal is defined to be a constant-driven signal.
2. Any signal that is driven by a buffer whose input is a constant-driven signal is a constant-driven signal.
3. Any signal that is driven by a multiplexer such that all of the data inputs of the multiplexer are constant-driven signals is also a constant-driven signal.
4. Any signal that is output of a register such that data input of the register is a constant-driven signal is also a constant-driven signal.

Figure 10:
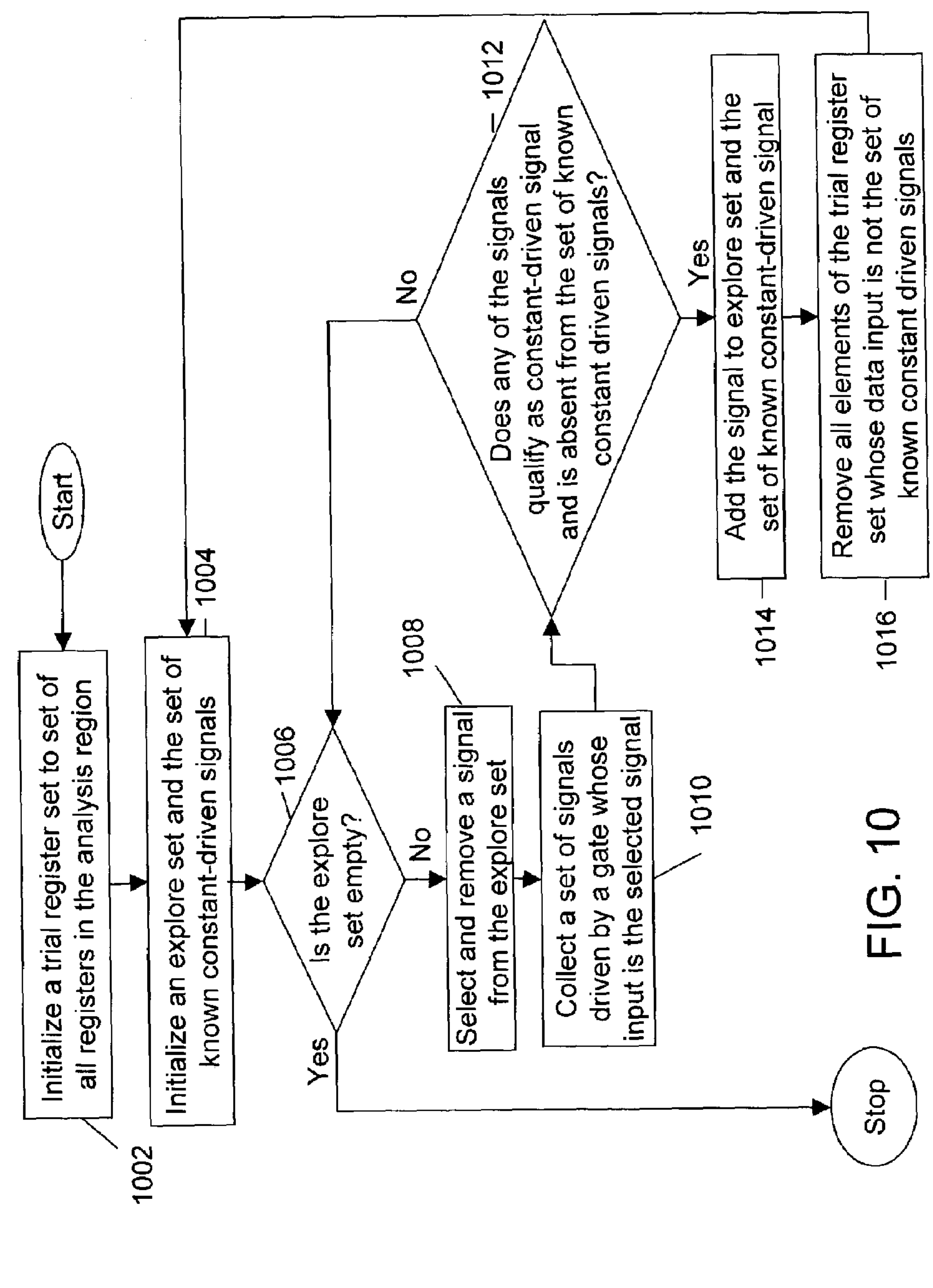
FIG. 10 is a flowchart depicting a method to identify all constant-driven signals in a circuit model.

Based on the abovementioned rules, a constant-driven signal is computed according to the method described using flowchart shown in FIG. 10. First step 1002 is to initialize a trial register set to the set of all registers in the selected analysis region. This is followed by the initialization of an explore set and a set of known constant-driven signals to the set of constant signals associated with the trial register set in step 1004. In step 1006, it is checked whether the explore set is empty. If the explore set is not empty then a signal is selected and removed from the explore set in step 1008. This is followed by collection of all the signals driven by a gate whose input is the selected signal in step 1010. In step 1012, all the collected signals that qualify as constant-driven signals and are absent from the set of known constant-driven signals are identified. If a constant-driven signal is absent from the set of known constant-driven signals, then it is added to the explore set and the known constant-driven signal set in step 1014. Further, in step 1016, all such elements of the trial register set whose data input is not in the set of known constant-driven signals are removed from the trial register set. The entire procedure is then repeated by sending the control to step 1004. Thus, all the constant-driven signals are computed iteratively.

The concept of a constant-driven signal is further highlighted using the following example, henceforth referred to as Example 1:

```
always @ (st or a) begin
  nextSt = st;
  case(st)
  2'b00: if (a) nextSt = 2'b01;
  2'b01: nextSt = (~a) ? 2'b10 : 2'b00;
  2'b10: nextSt = 1'b00;
  endcase
end
always @(posedge clk or posedge rst)
  if (rst) begin
    st <= 2'b00;
    st2 <= 2'b00;
  end else begin
    st <= nextSt;
    st2 <= nextSt + nextSt;
end
```

Figure 11:
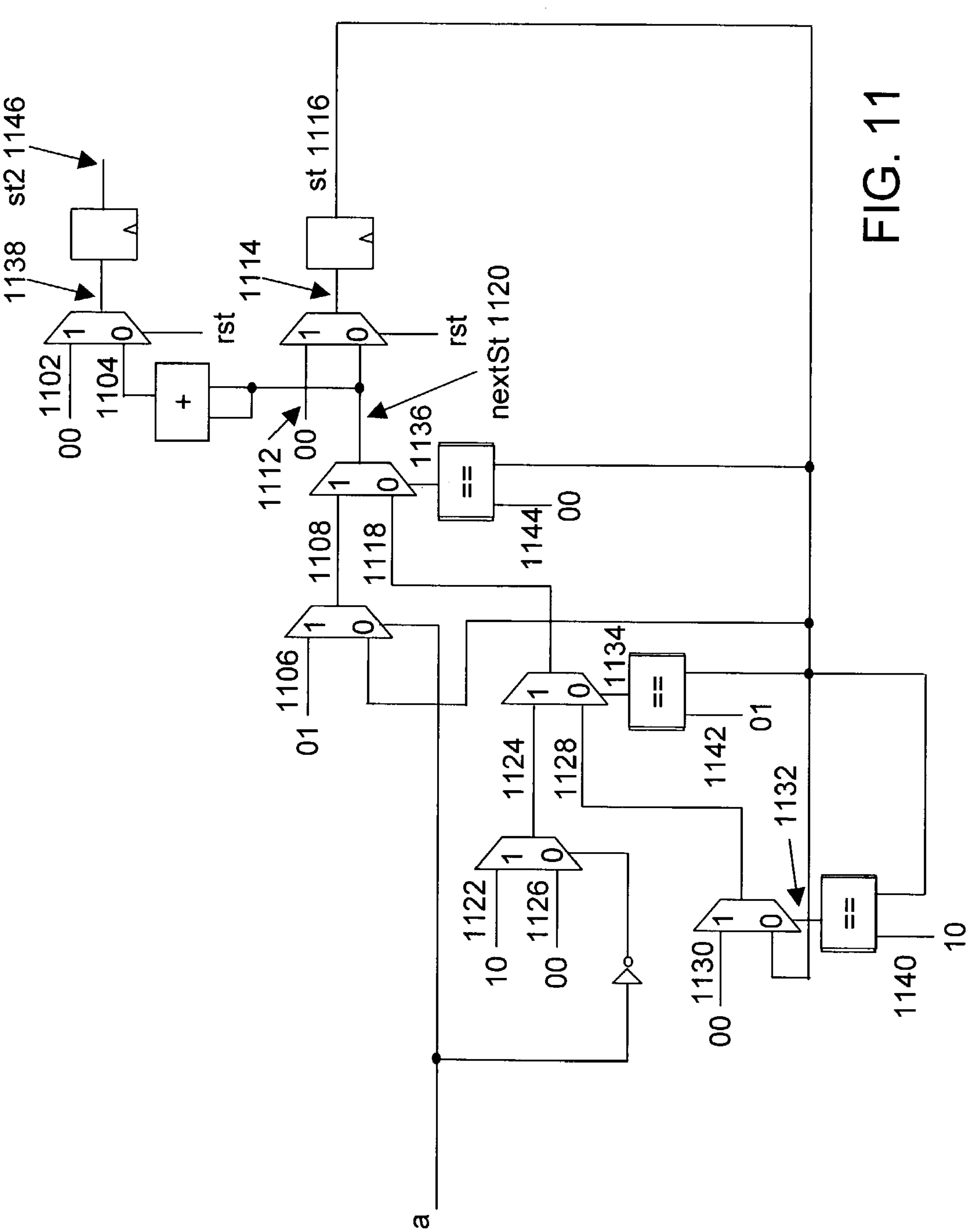
FIG. 11 is a circuit diagram depicting an example to illustrate the notion of constant-driven signals.

Example 1 is a Verilog program for a circuit model. FIG. 11 is a gate-level representation of Example 1. The constant signals are signals 1102, 1106, 1112, 1122, 1126, 1130, 1140, 1142 and 1144. The initial trial register set comprises signals st 1116 and st2 1146. After the above method terminates, identified constant-driven signals are signals 1102,

1106–1116, 1118–1130 and 1140–1144. In Example 1, signals nextSt 1120 and st 1116 are classified as constant-driven signals, whereas signal st2 1146 is not classified as a constant-driven signal.

Constant-driven signals are used to identify State Machine signals. A State Machine is a set of registers from the design. A set of registers from the design are classified as a State Machine by one of the following three rules:

1. The set of registers forms a wide signal, and the wide signal is designated as a constant-driven signal.
2. The set of registers forms a wide signal, and the signal only drives equal (==) nodes such that the other input of each such equal node is always a constant.
3. The user explicitly identifies a wide signal formed by a set of registers as a State Machine.

In Example 1, signal st 1116 is a State Machine signal. Further, st2 1146 is not identified as a State Machine signal according to the first two rules because it is not a constant-driven signal. Thus, according to rule 3, if the user does not specify st2 1146 as a State Machine signal, it does not become a State Machine signal.

Figure 12:
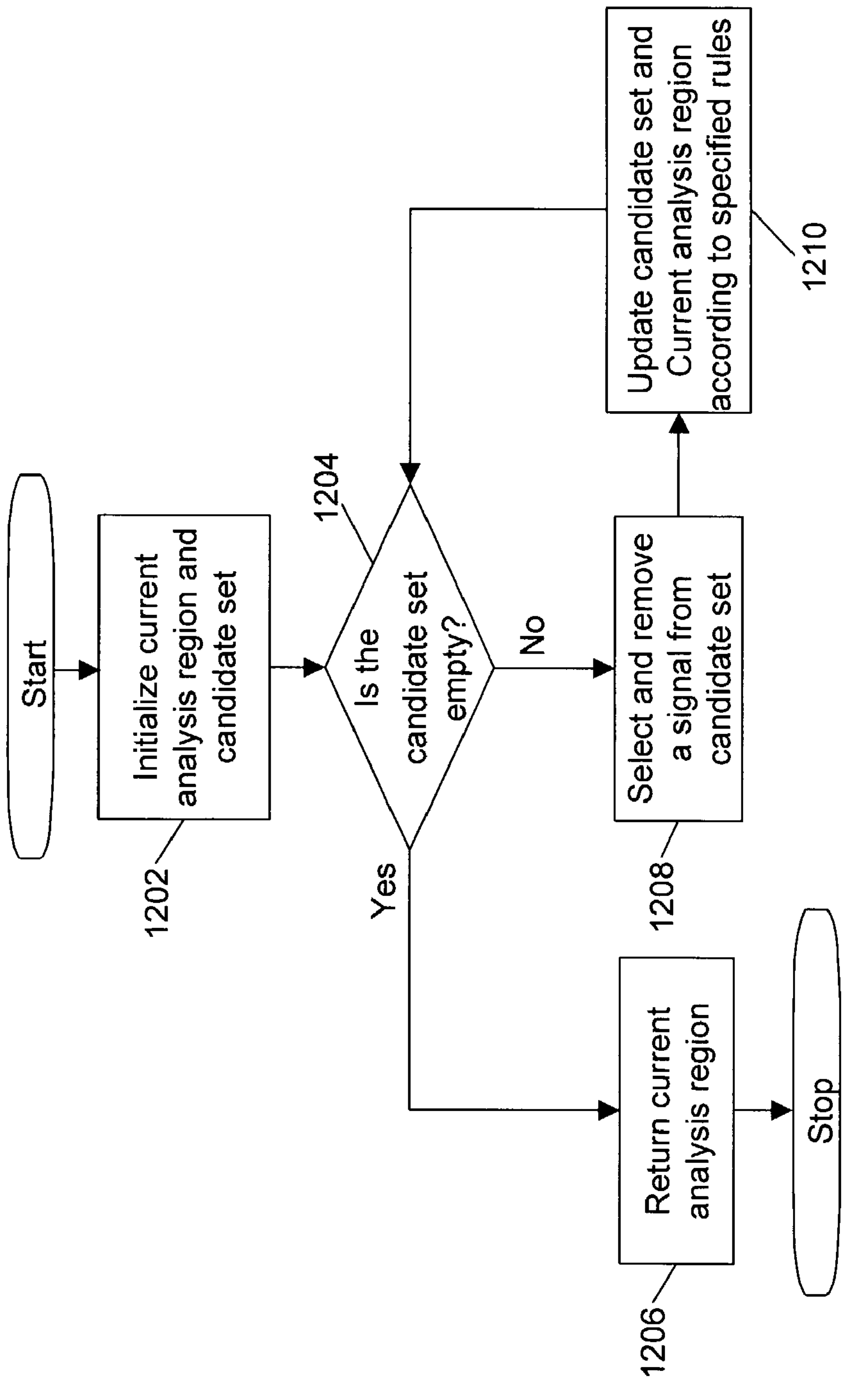
FIG. 12 is a flowchart depicting the method to identify an initial analysis region in accordance with the present invention.

The concept of constant-driven signals and State Machine signals are used to determine an initial analysis region. The initial analysis region is determined using the method shown in FIG. 12. In step 1202, initialization of the current analysis region and a candidate set is performed. The current analysis region is initialized to all signals directly referred to by either the property to be verified or the set of environmental constraints. The candidate set is also initialized to the current analysis region. In step 1204, the candidate set is checked as to whether it is empty. If the candidate set is empty, then the initial analysis region has been identified and the method is stopped in step 1206. If the candidate set is not empty, a signal is selected and removed from the candidate set in step 1208. The selected signal is then used to update the current analysis region and the candidate set in step 1210. This is done according to the following rules:

1. If the signal is driven by a datapath operator (*, +, −, <, >, <<, >>, reduction operator), no signal is added to the candidate set, and the current analysis region remains the same.
2. If the signal is driven by an equal (==) operator, the operands are each multi-bit variables, and neither is a constant, no new signal is added to the candidate set, and the current analysis region remains the same.
3. If the signal is driven by the select operator on a memory signal or an array signal, no new signal is added to the candidate set, and the current analysis region remains the same.
4. If the signal is driven from a higher level of design hierarchy (that is, the signal is an input to the current instance from the instance in which it was instantiated), no new signal is added to the candidate set, and the current analysis region remains the same.
5. If the signal satisfies following conditions:
   a. It is the output of a register,
   b. It is more than a single-bit wide, and
   c. It is not a State Machine signal; then no new signal is added to the candidate set; and the current analysis region remains the same.
6. For any other signal, the signals that drive the gate that drives this signal are added to the candidate set, and the same set of signals is added to the analysis region.

After updating the candidate set and the current analysis region, the candidate set is again checked in step 1204. Thus, the initial analysis region is iteratively identified.

The method of generating the initial analysis region is further described using the following example, henceforth referred to as Example 2:

```
module top (clk, rst, sense, indicator, light_st, phase);
input clk, rst, sense;
input [31:0] indicator;
output [1:0] light_st;
output [1:0] phase;
```

```
prune inst1 (clk, rst, phase, enable, indicator, light_st);
out_sm inst2 (clk, rst, sense, phase, enable);
endmodule
module prune (clk, rst, phase, enable, indicator, light_st);
input clk, rst;
input [1:0] phase;
input enable;
input [31:0] indicator;
output [1:0] light_st;
reg [1:0] st, next_st;
reg [4:0] counter;
wire timeout = (counter > 5'd20);
wire signal = (phase == 2'b00) || (enable);
wire dismiss = indicator[counter];
`define RED 2'b00
`define YELLOW 2'b10
`define GREEN 2'b01
assign light_st = st;
always @(st or signal or dismiss or timeout) begin
  case(st)
  `RED: if ((signal) && (dismiss)) next_st = `YELLOW;
    else if (signal) next_st = `GREEN;
      else next_st = `RED;
  `YELLOW: if (timeout) next_st = `RED;
    else next_st = `YELLOW;
  `GREEN: if (~signal) next_st = `YELLOW;
    else next_st = `GREEN;
  default: next_st = st;
  endcase
end
always @(posedge clk or posedge rst)
if (rst) begin
  st <= `RED;
end else begin
  st <= next_st;
end
always @(posedge clk or posedge rst)
if (rst) begin
  counter <= 5'd0;
end else begin
  if (enable) begin
    if (counter == 5'd20) counter <= 5'd0;
    else counter <= counter + 5'd1;
  end
end
endmodule
module out_sm (clk, rst, sense, phase, enable);
input clk, rst, sense;
output enable;
output [1:0] phase;
reg [1:0] phase;
wire enable = ((phase == 2'b01) & (~sense)) || ((phase == 2'b10) &
(sense));
always @(posedge clk or posedge rst)
if (rst) begin
  phase <= 2'b00;
end else begin
  case(phase)
   2'b00: if (sense) phase <= 2'b01;
    else phase <= 2'b10;
   2'b01: if (~sense) phase <= 2'b00;
   2'b10: if (sense) phase <= 2'b00;
  endcase
end
endmodule
```

Example 2 is a Verilog program describing a circuit model. Suppose the property to be verified is "(inst1.light_st=='YELLOW)=>(inst1.phase==2'b00)", and there are no environmental constraints. According to the method to determine the initial analysis region, the initial analysis region is the emphasized portion in Example 2.

To illustrate the method, consider an iteration of the method as follows. State Machine signals in Example 2 are inst1.st and inst2.phase. The current analysis region comprises signals inst1.light_st and inst1.phase. The candidate set also comprises signals inst1.light_st and inst1.phase. According to steps 1204–1208, signal inst1.light st is extracted from the candidate set. Step 1210 results in the addition of signal inst1.st to the candidate set as well as to the current analysis region. This implies that the current analysis region is now updated and comprises signals inst1.st, inst1.light_st and inst1.phase. Candidate set is also updated and comprises signals inst1.st and inst1.phase. Steps 1204–1210 are repeated by extracting another signal from the candidate set and updating the candidate set and the analysis region. The process is stopped when all the signals in the candidate set are exhausted.

The process results in the selection of initial analysis region represented by the portion of the Verilog program that is emphasized in Example 2. For instance, signal inst1.dismiss is not emphasized i.e. signal inst1.dismiss is not included in the initial analysis region because it is driven by the select of an array (signal inst1.indicator). Signal inst1.phase is not included in the initial analysis region because it is driven from a higher level of hierarchy.

Appropriate choice of initial analysis region reduces the run-time for checking a property. Another way of optimizing run-time of the property checking method is by using information computed in previous runs. This method involves use of a set of Known Reachable and Known Unreachable states computed in previous run.

To optimize the run-time, the set of initial states is initialized to a set of states that is known to be reachable, instead of using the initial set as described in step 808 (FIG. 8) of Method A. Initialization of initial set to a Known Reachable set reduces the number of iterations of steps 810–816 in Method A. The process starts with the initialization of the set of initial states in step 808 and then the new states are added. The new states are those that can be reached after one iteration from the current reachable set. The algorithm terminates when a fixed point is obtained, i.e., no new states can be reached. If the algorithm starts from a set of states that is larger than the initial state set, then it is likely that fewer additional steps (possibly none) are required to reach the fixed point. Hence, using the set of Known Reachable states from the previous run reduces the overall computation time for verification. A set of states can be pre-computed to be reachable in the current run using a reachable set of the previous run. For example, a reachable state of a previous run can be treated as a Known Reachable state for current run if the previous run was proving a different property than the current run, but the analysis region and the set of environmental constraints were same as the current run.

As mentioned above, a set of Known Unreachable states in the previous run can also be used to optimize the run-time of the property checking method. The set of states in the design found to be unreachable during a property check are referred to as the set of Known Unreachable states.

The following are some of the conditions under which a set of Known Unreachable states from a previous run can be used to determine unreachable states for the current run:

1. If the previous run computed a set of Known Unreachable states and the set of environmental constraints is increased from a previous run to the current run, then the set of Known Unreachable states in the previous run is also unreachable for the current run.
2. If the current run is verifying a different check from a previous run but the set of environmental constraints as well as the analysis region remain the same, and the previous run computed a set of Known Unreachable states, then the set of Known Unreachable states in the previous run is also unreachable for the current run.
3. If the analysis region is increased from the previous run to the current run, the number of states gets multiplied by $2^m$ where m is the number of registers in the added portion of the analysis region. If the previous run computed a set of Known Unreachable states, all the states in the projection of these states into new state space will also be unreachable for the current run.

Figure 13:
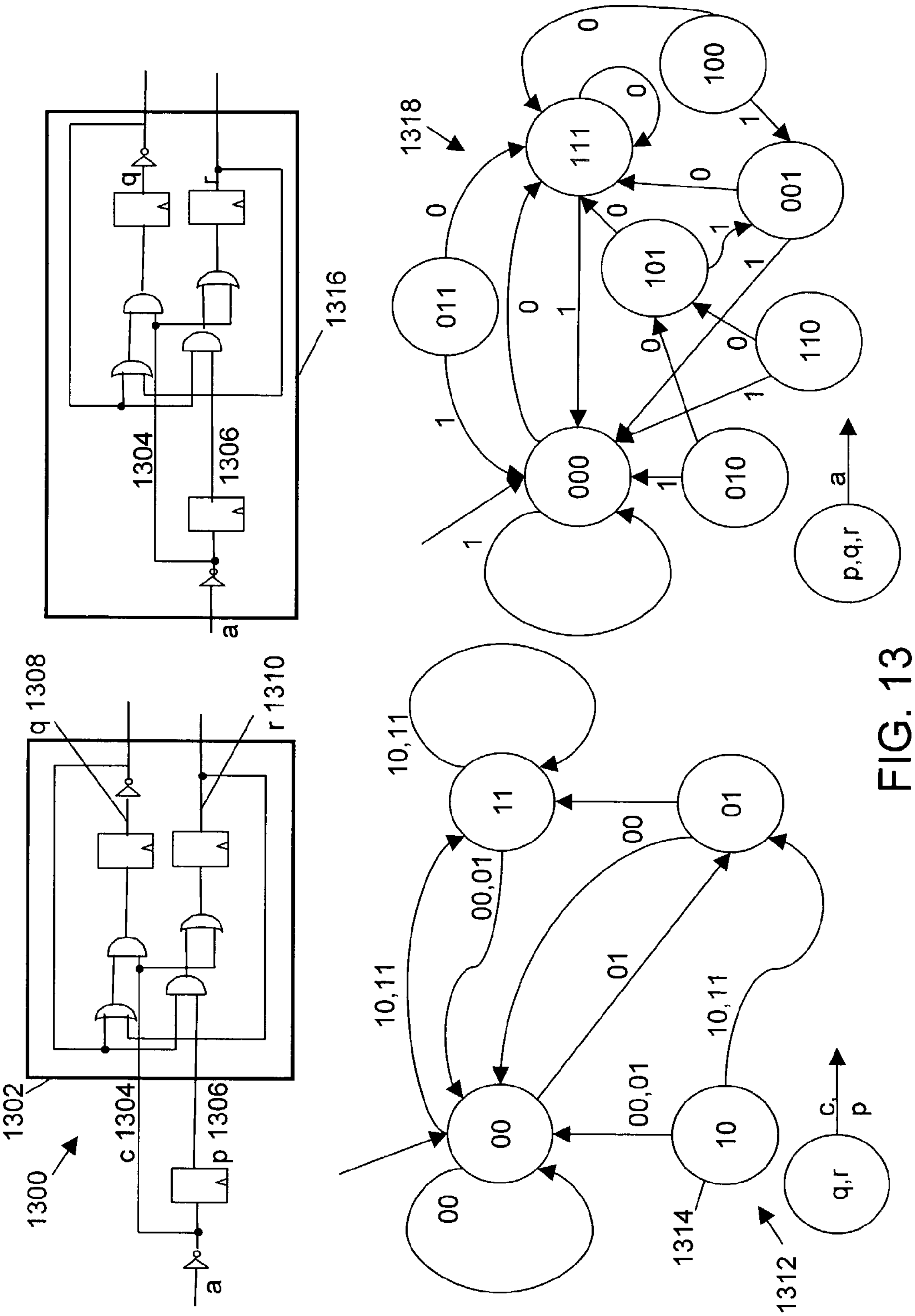
FIG. 13 shows two different analysis regions of a circuit model and their corresponding state transition diagrams.

The abovementioned third condition is further highlighted using FIG. 13. FIG. 13 shows a circuit model 1300 and its corresponding analysis region 1302. The Known Unreachable state is determined using the associated state transition diagram 1312. State transition diagram 1312 shows the transition of output signals q 1308 and r 1310 from one state to another depending on the values of signals c 1304 and p 1306. For analysis region 1302, state transition diagram 1312 shows that state 1314 is unreachable. New analysis region 1316 for circuit model 1300 is obtained by expanding analysis region 1302 by adding a register whose output is p 1306. The number of states is increased by a factor of 2 because one register was added to analysis region 1302.

The set of Known Unreachable states for analysis region 1302 is '10'. Hence, the set of Known Unreachable states for analysis region 1316 that comprises the projection of the set of Known Unreachable states from the previous analysis region 1300, are '010' and '110' (register p can have values '0' or '1'). It can be determined that these two states are unreachable even before reachability test is performed on analysis region 1316. State transition diagram 1318 verifies that the states '010' and '110' are unreachable for analysis region 1316.

The set of Known Unreachable states thus determined may be used in the following ways to speedup the step of computation of the next reachable state:

1. BDD representation of the next state functions is reduced for registers computed in step 820 (FIG. 8) of Method A by using the set of Known Unreachable states as a 'don't care' function. Once a 'don't care' function is known, there are well-known methods to reduce the size of the BDD representations. For example, T. R. Shiple et al., "Heuristic Minimization of BDDs using Don't Cares", Proceedings of the Design Automation Conference, 1994, describes one such method.
2. Next state variables in the computation of Known Reachable states (step 820) of Method A that can be represented as combinational functions of other registers, are eliminated. The set of Known Unreachable states is used to determine the combinational functions. The procedure to replace the registers with combinational functions of other registers is illustrated in S. Qadeer et al., "Latch Redundancy Removal Without Global Reset", Proceedings of the International Conference on Computer Design, October 1996.
3. The set of Known Unreachable states may also be used to simplify the computation during the step of computation of the next reachable set (Step 820 of Method A). One such method is described by C. A. J. Van Eijk et al., in "Exploiting Functional Dependencies in State Machine Verification", Proceedings of the European Design and Test Conference ED&TC 1996, pp. 9–14, 1996.

If none of the three conditions under which a set of states is unreachable during the current run are true, following approach is followed for efficient computation. If the set of unreachable states in the previous runs is known, these sets are used as guesses for the combinational replacement of next-state functions. This is because between runs that are close to each other, there is no substantial change in the design analysis region, and the set of environmental constraints. Hence, the replacement functions derived from the set of Known Unreachable states of the previous runs turn out to be the correct guesses.

Van Eijk et al. describe in their publication the idea of using guesses for combinational replacement functions during the step of computation of next reachable set (step 820 of Method A). In the conventional method as described using FIG. 7, it is a matter of chance if the guesses turn out to be correct. In the preferred embodiment, the final reached set of previous runs is used to guide the guesses. This results in a much better chance of guesses being correct. The details of using guesses for combinational replacement functions are described in the abovementioned Van Eijk paper. It should be noted that the computational time for the step of computation of the next reachable set using the next-state functions (step 820 of Method A) is reduced when the guesses turn out to be accurate.

Since the effectiveness of using Van Eijk's method relies on how often the guesses turn out to be true, using guesses based on Known Unreachable states from the previous runs allows present invention to have better performance than the conventional method described using FIG. 7. This is because of the fact that the guesses used in the conventional methods are not based on the information from previous runs.

If the specified property is false in context of the current analysis region, then a modified analysis region is generated in the method in accordance with the present invention. The present invention allows for interactive expansion of the analysis region to generate the modified analysis region. For example, consider a circuit model in Verilog language referred henceforth as Example 3:

```
module update (clk, rst, out, in);
input clk, rst, in;
output out;
reg qp, qn;
assign out = (qp ^ qn);
always @(posedge clk or posedge rst)
if (rst) begin
   qp <= 1'b1;
   qn <= 1'b0;
end else begin
   qp <= in;
   qn <= ~in;
end
endmodule
```

Suppose the property to be verified is (out==1'b1) and that the initial analysis region includes the signals out, qp and qn but not the signal in or its complement ~in. Since, the signals driving the register signals qp and qn are not included in the analysis region, they are treated as inputs. This results in the property to be false, and a counterexample is generated. In Example 3, the counterexample is either (qp=1'b0 and qn=1'b0) or (qp=1'b1 and qn=1'b1).

The user may expand the analysis region by explicitly selecting registers qp and qn, and adding the combinational fan-in of these (in and ~in respectively) to the analysis region. The property (out==1'b1) is then true in context of the modified analysis region.

Alternatively, instead of expanding the analysis region by explicitly selecting registers, the user may expand the analysis region by specifying a second property, and adding all signals and their combinational fan-in to the analysis region. In Example 3, the user can specify a second property (out==qn^qp). This expands the analysis region to include signals in and ~in. The property (out==1'b1) is then true in context of the modified analysis region.

Another method of specifying a second property is to select signals (and the corresponding times) of the counterexample and requiring that at least one of the signals differs from the corresponding value in the counterexample. For example, suppose the counterexample selected when proving the original property (out==1'b1) is (qp=1'b0, qn=1'b0). The user could select signals qp and qn and require that at least one of the signals differs from the corresponding value in the counterexample. This is equivalent to specifying a second property ((qp!=1'b0)||(qn!=1'b0)). As in the previous example, the property (out==1'b1) would then be true in the context of the modified analysis region.

The preferred embodiment allows for expansion of the analysis region to verify the property of the circuit model if the specified property is false in context of the current analysis region. This expansion is internal to the circuit model. An alternative way to verify the property of the circuit model is to add environmental constraints to the circuit model. This includes addition of a new logic corresponding to the environmental constraints in the form of an additional circuit model outside the circuit model into the analysis region. The addition of the new logic is performed without making any modifications to the description of the circuit model. The present invention permits the user to connect the additional circuit model to the existing circuit model in order to specify related properties and the set of environmental constraints. The present invention has the advantage that the user can define properties and environmental constraints entirely in terms of the primary inputs and outputs of the circuit model. The user does not need to understand the internal details of the circuit model being checked.

Figure 14:
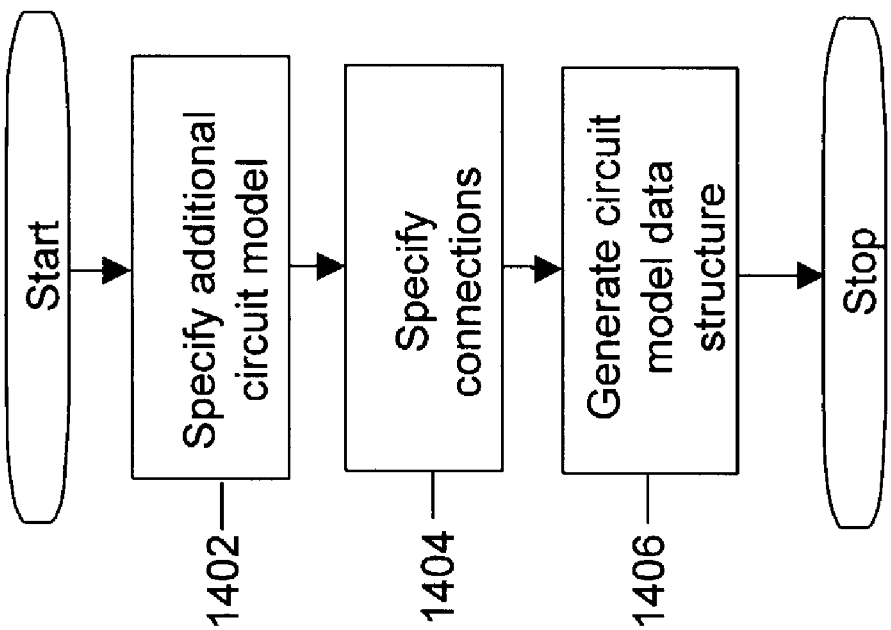
FIG. 14 is a flowchart depicting a method for connecting an additional circuit model to a circuit model.

The method of connecting additional circuit model to the circuit model is further described using a flowchart shown in FIG. 14. The first step in providing a connection between the circuit model and an additional circuit model is to specify additional circuit model in step 1402 and connection between the two models in step 1404. The specification of the connection is followed by step 1406. In step 1406, a data structure that represents the connections between the circuit model and additional circuit models is generated.

Figure 15:
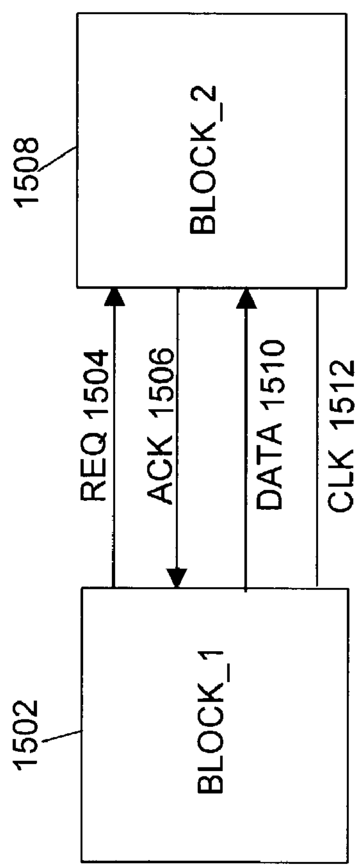
FIG. 15 is a block diagram depicting an exemplary design showing an interface between two blocks.

The method by which the present invention permits the user to connect additional circuitry is described using the following example. FIG. 15 shows an example of a design with two interacting circuit models, BLOCK_1 1502 and BLOCK_2 1508. BLOCK_1 1502 needs to pass single bit of information to BLOCK_2 1508 by means of a simple inter-block communication protocol. The communication protocol comprises two interface control signals REQ 1504 and ACK 1506. Signal REQ 1504 is driven by BLOCK_1 1502 and indicates that a bit of data is available. Signal ACK 1506 is driven by BLOCK_2 1508 and indicates that BLOCK_2 1508 has accepted the bit of data.

Figure 16:
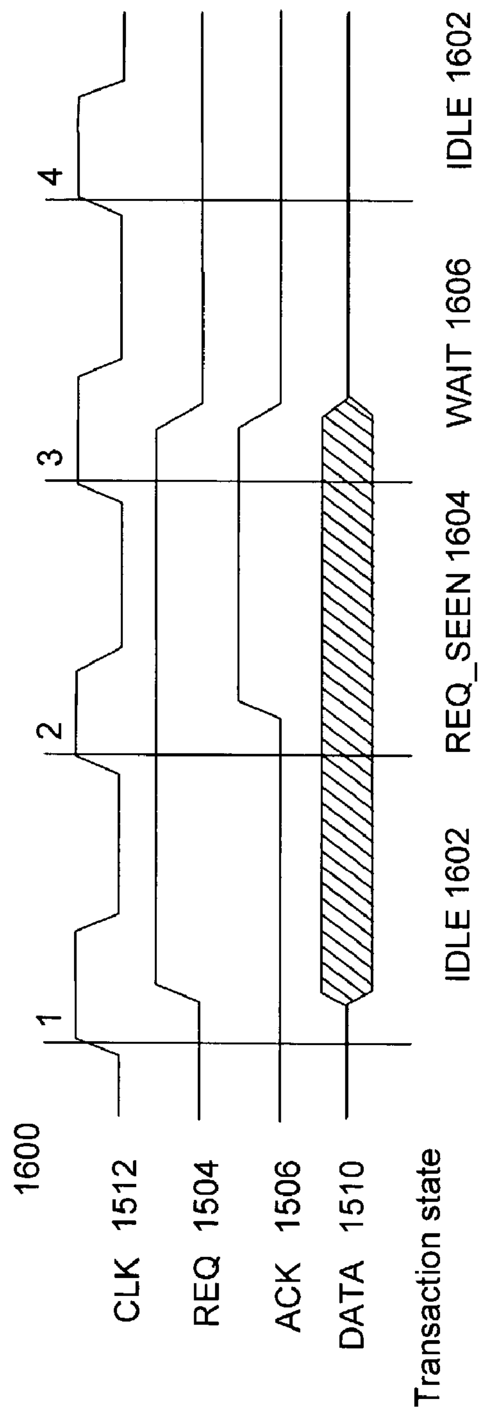
FIG. 16 is a timing diagram depicting a communication protocol to pass single bit of data between two blocks of the circuit model shown in FIG. 15.

The communication protocol is illustrated by means of a timing diagram in FIG. 16. FIG. 16 also indicates the current status of the transaction. Initially, the transaction is in an IDLE state 1602. BLOCK_1 1502 initiates a request to BLOCK_2 1508 by driving signal REQ 1504. As a result, the transaction enters state REQ_SEEN 1604. When BLOCK_2 1508 reads the data, it acknowledges BLOCK_1 1502 by driving signal ACK 1506 for a single cycle, and the transaction enters WAIT state 1606. After exactly one cycle, the transaction returns to IDLE state 1602. The state of the communication protocol at any clock cycle is described using the state transition diagram in FIG. 17.

Figures 17, 18:
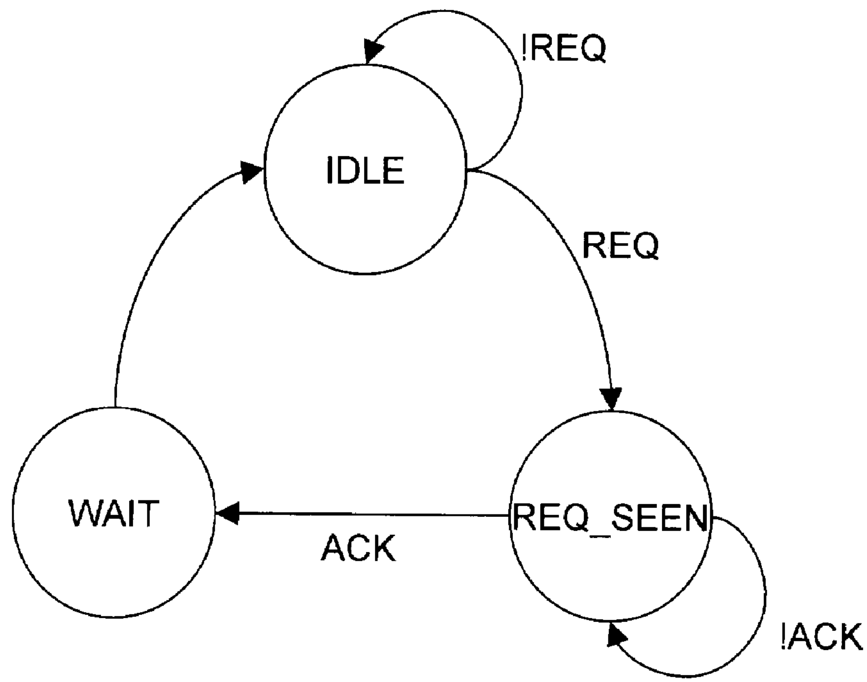
FIG. 17 is a state transition diagram depicting a model for communication protocol transaction state.
FIG. 18 is formulas (in equation form) depicting the desired behavior of REQ and ACK signals of FIG. 15.

The formulas in FIG. 18 describe the desired behavior of signals REQ 1504 and ACK 1506. Signal REQ_VALID 1802 is true whenever signal REQ 1504 has desired value. Signal ACK_VALID 1804 is true whenever signal ACK 1506 has desired value. Signals corresponding to states IDLE 1602, REQ_SEEN 1604 and WAIT 1606 are true if and only if the communication protocol is in IDLE state 1602, REQ_SEEN state 1604 or WAIT state 1606, respectively.

Figure 19:
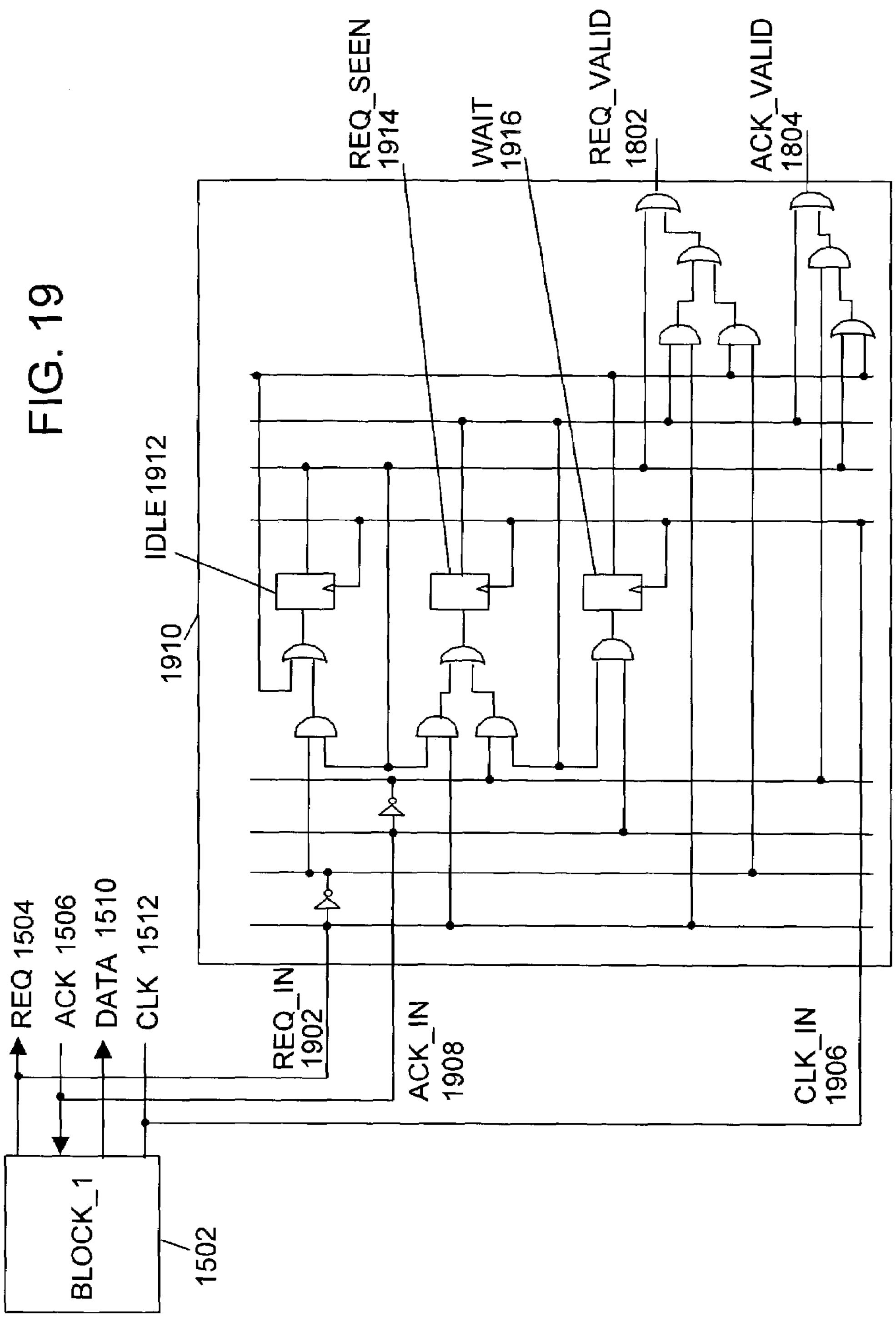
FIG. 19 is a circuit diagram depicting the additional circuit model used to verify the communication protocol between two blocks of the circuit model of FIG. 15.

To check if BLOCK_1 1502 correctly implements the communication protocol, additional circuit model is connected to BLOCK_1 1502. FIG. 19 shows the desired connections between BLOCK_1 1502 and an additional circuit model 1910. Additional circuit model 1910 encapsulates the communication protocol state and the formula describing the desired behavior of signals REQ 1504 and ACK 1506. The method of encapsulation is performed using a method well-known in the art such as that described in K. Shimizu et al., "Monitor-Based Formal Specification of PCI", Proceedings of the 3rd International Conference of Formal Methods in Computer-Aided Design, November 2000. To connect BLOCK_1 1502 and additional circuit model 1910, signal REQ 1504 of BLOCK_1 1502 is connected to signal REQ_IN 1902. Further, signal ACK 1506 of BLOCK_1 1502 is connected to signal ACK_IN 1908. Clock input from BLOCK_1 1502, CLK 1512 is connected to signal CLK_IN 1906. Further, in additional circuit model 1910, registers IDLE 1912, REQ_SEEN 1914 and WAIT 1916 that correspond to signals corresponding respectively to states IDLE 1602, REQ_SEEN 1604 and WAIT 1606 are initialized to value '0'.

The connection between BLOCK_1 1502 and additional circuit model 1910 is represented as a data structure. FIG. 20 shows the data structure representing the combined circuit model comprising circuit model BLOCK_1 1502 and additional circuit model 1910. Data structure 2002 represents BLOCK_1 1502 and additional circuit model 1910 as two independent, unconnected designs. Data structure 2004 is used to represent the connections between BLOCK_1 1502 and additional circuit model 1910. For instance, data structure 2004 indicates that additional circuit model input REQ_IN 1902 (represented by database id 113) is connected to circuit model signal REQ 1504 (represented by database id 100).

To check that BLOCK_1 1502 correctly implements the logic that drives signal REQ 1504, signal ACK_VALID 1804 is specified as an environmental constraint, and signal REQ_VALID 1802 is specified as a property to be checked.

Similarly, to check that BLOCK_2 1508 correctly implements the logic that drives signal ACK 1506, signal REQ_VALID 1802 is specified as an environmental constraint, and signal ACK_VALID 1804 is specified as a property to be checked.

For checking whether the combined circuit model correctly implements the logic that drives signals REQ 1504 and ACK 1506, both ACK_VALID 1804 and REQ_VALID 1802 signals are specified as properties.

In the preferred embodiment, the system of the present invention is executed on a general-purpose computer, for example, of the type commercially available from Sun Microsystems, Inc., of Mountain View, Calif. Various methods (as shown in FIGS. 8, 9, 10, 12 and 14) are implemented using any high level programming language including Java, C++.

While the preferred embodiments of the invention have been illustrated and described, it will be clear that the invention is not limited to these embodiments only. Numerous modifications, changes, variations, substitutions and equivalents will be apparent to those skilled in the art without departing from the spirit and scope of the invention as described in the claims.

What is claimed is:

1. A computer based method for verifying properties of a circuit model, the method comprising the steps of:

receiving at least one property to be checked;

receiving a set of environmental constraints: and identifying an analysis region in a context of which the property is satisfied under the set of environmental constraints having the steps of:

a. selecting an analysis region;

b. creating an additional circuit model that models the properties and the set of environmental constraints of the circuit model;

c. expanding said analysis region to include the additional circuit model;

d. checking the property in the context of said analysis region using said set of environmental constraints and the circuit model;

e. interactively modifying said analysis region when the property is not satisfied using said set of environmental constraints in said analysis region, having the steps of:

providing analysis region information to a user, receiving user data from a user, and modifying said analysis region based upon said user data.

2. A computer based method for verifying properties of a circuit model, the method comprising the steps of:

receiving at least one property to be checked;

receiving a set of environmental constraints; and identifying an analysis region in a context of which the property is satisfied under the set of environmental constraints having the steps of:

a. selecting an analysis region;

b. checking the property in the context of said analysis region using said set of environmental constraints and the circuit model;

c. interactively modifying said analysis region when the property is not satisfied using said set of environmental constraints in said analysis region, having the steps of:

i. initializing a candidate set of signals according to said analysis region, ii. removing a first signal from the candidate set, iii. presenting a first subset of signals derived from said first signal to a user from the candidate set according to a set of rules, iv. receiving a second subset of signals from a user, said second subset being a subset of said first subset, v. updating said analysis region and the candidate set based upon said second subset; and vi. repeating steps u-v until the candidate set is empty.

3. The method of claim 2 wherein said second subset is the null set.

4. A computer based method for verifying properties of a circuit model, the method comprising the steps of:

receiving at least one property to be checked;

receiving a set of environmental constraints;

identifying an analysis region in a context of which the property is satisfied under the set of environmental constraints having the steps of:

a. automatically selecting said analysis region, b. identifying a set of constant-driven signals in the circuit model, c. checking the property in the context of said analysis region using said set of environmental constraints and the circuit model; and d. modifying said analysis region when the property is not satisfied using said set of environmental constraints in said analysis region comprising the steps of i. initializing a candidate set of signals according to said analysis region, ii. removing a first signal from the candidate set, iii. updating the candidate set according to a first set of rules relating to said first signal and said identified set of constant-driven signals, iv. updating said analysis region according to a second set of rules relating to said first signal and said identified set of constant-driven signals, and v. repeating steps ii-iv until the candidate set is empty.

5. The method according to claim 4, wherein the analysis region is initialized to all signals referred by the set of environmental constraints.

6. The method according to claim 4, wherein the analysis region is initialized to all signals referred by the property.

7. The method of claim 4 further comprising the step of:

repeating steps c-d either until the property is true in the context of said analysis region or until a design problem is identified.

8. The method according to claim 7, wherein the step of checking the property comprises the step of:

determining a set of Known Reachable states;

wherein the step of checking the property uses the set of Known Reachable states from a previous iteration.

9. The method according to claim 7, wherein the step of checking the property comprises the step of:

determining a set of Known Unreachable states;

wherein the step of checking the property uses the set of Known Unreachable states from a previous iteration.

10. The method of claim 4 further comprising the step of:

repeating steps b-d either until the property is true in the context of said analysis region or until a design problem is identified.

11. The method of claim 4 wherein said step of modifying said analysis region further comprises the step of:

identifying said set of constant-driven signals in the circuit model.

12. The method of claim 4 wherein said step of automatically selecting comprises the step of:

identifying a set of State Machine signals in the circuit model, wherein said step of updating a candidate set updates said candidate set according to a set of rules relating to said first signal, said identified set of constant-driven signals and the identified set of State Machine signals; and wherein said step of updating said analysis region updates said analysis region according to a set of rules relating to said first signal, said identified set of constant-driven signals and the identified set of State Machine signals.

13. The method of claim 4 wherein said step of initializing said candidate set comprises the steps of:

generating a counterexample corresponding to the analysis region in the context of which the property is not satisfied under the set of environmental constraints; and identifying as signals in said candidate set those signals that are inputs to said analysis region and are part of said counterexample.

14. A computer program embodied in a tangible medium and capable of being read by a computer, for performing the method of claim 4.

15. A computer based method for verifying properties of a circuit model, the method comprising the steps of:

receiving at least one property to be checked;

receiving a set of environmental constraints;

identifying an analysis region in context of which the property is satisfied under the set of environmental constraints having the steps of:

a. automatically selecting said analysis region comprising the steps of:

b. identifying a set of State Machine signals in the circuit model, c. checking the property in the context of said analysis region using said set of environmental constraints and the circuit model; and d. modifying said analysis region using the property when the property is not satisfied using said set of environmental constraints in said analysis region comprising the steps of i. initializing a candidate set of signals according to said analysis region, ii. removing a first signal from the candidate set, iii. updating the candidate set according to a first set of rules relating to said first signal and said identified set of State Machine signals, iv. updating said analysis region according to a second set of rules relating to said first signal and said identified set of State Machine signals, and v. repeating steps ii-iv until the candidate set is empty.

16. The method of claim 15 further comprising the step of:

repeating steps c-d either until the property is true in the context of said analysis region or until a design problem is identified.

17. The method according of claim 16, wherein the step of checking the property comprises the step of:

determining a set of Known Reachable states;

wherein the step of checking the property uses the set of Known Reachable states from a previous iteration.

18. The method according of claim 16, wherein the step of checking the property comprises the step of:

determining a set of Known Unreachable states;

wherein the step of checking the property uses the set of Known Unreachable states from a previous iteration.

19. The method of claim 15 further comprising the step of:

repeating steps b-d either until the property is true in the context of said analysis region or until a design problem is identified.

20. The method of claim 15 wherein said step of modifying the analysis region further comprises the step of:

identifying said set of State Machine signals in the circuit model.

21. The method of claim 15 wherein said step of initializing said candidate set comprises the steps of:

generating a counterexample corresponding to said analysis region in the context of which the property is not satisfied under the set of environmental constraints; and identifying as signals in said candidate set those signals that are inputs to said analysis region and are part of said counterexample.

22. The method according to claim 15 wherein said analysis region is initialized to all signals referred by the property.

23. The method according to claim 15, wherein said analysis region is initialized to all signals referred by the set of environmental constraints.

24. A computer program embodied in a tangible medium and capable of being read by a computer, for performing the method of claim 15.

25. A computer based method for verifying properties of a circuit model, the method comprising the steps of:

receiving at least one property to be checked;

receiving a set of environmental constraints; and identifying an analysis region in a context of which the property is satisfied under the set of environmental constraints having the steps of:

a. selecting an analysis region;

b. checking the property in the context of said analysis region using said set of environmental constraints and the circuit model; and c. interactively modifying said analysis region when the property is not satisfied using said set of environmental constraints in said analysis region, having the steps of:

i. initializing a candidate set of signals according to said analysis region, ii. presenting the candidate set of signals to a user, iii. receiving a first subset of signals from a user, said second subset being a subset of the candidate subset, and iv. updating said analysis region based upon said first subset.

* * * * *

UNITED STATES PATENT AND TRADEMARK OFFICE

CERTIFICATE OF CORRECTION

PATENT NO. : 7,020,856 B2 Page 1 of 1
APPLICATION NO. : 10/389316
DATED : March 28, 2006
INVENTOR(S) : Vigyan Singhal and Joseph E. Higgins It is certified that error appears in the above-identified patent and that said Letters Patent is hereby corrected as shown below:

Column 19,
Line 1, please replace “u-v” with --ii-v--.

Signed and Sealed this

Eleventh Day of July, 2006

JON W. DUDAS
*Director of the United States Patent and Trademark Office*